(12) United States Patent
Heston et al.

(10) Patent No.: US 7,982,544 B2
(45) Date of Patent: Jul. 19, 2011

(54) METHOD AND SYSTEM FOR AMPLIFYING A SIGNAL USING A TRANSFORMER MATCHED TRANSISTOR

(75) Inventors: John G. Heston, Murphy, TX (US); Jon Mooney, Dallas, TX (US)

(73) Assignee: Raytheon Company, Waltham, MA (US)

(*) Notice: Subject to any disclaimer, the term of this patent is extended or adjusted under 35 U.S.C. 154(b) by 0 days.

(21) Appl. No.: 13/036,179

(22) Filed: Feb. 28, 2011

(65) Prior Publication Data

US 2011/0140787 A1    Jun. 16, 2011

Related U.S. Application Data

(63) Continuation of application No. 12/257,824, filed on Oct. 24, 2008, now Pat. No. 7,898,340.

(51) Int. Cl.
*H03F 3/191*    (2006.01)
(52) U.S. Cl. .................................. 330/302; 330/190
(58) Field of Classification Search .................. 330/185, 330/188, 190, 276, 302
See application file for complete search history.

(56) References Cited

U.S. PATENT DOCUMENTS

| | | | |
|---|---|---|---|
| 4,042,887 A * | 8/1977 | Mead et al. | 330/302 |
| 4,647,867 A | 3/1987 | Butler et al. | |
| 5,179,461 A | 1/1993 | Blauvelt et al. | |
| 5,726,603 A * | 3/1998 | Chawla et al. | 330/276 |
| 6,407,647 B1 | 6/2002 | Apel et al. | |

OTHER PUBLICATIONS

PCT, Notification of Transmittal of International Search Report and the Written Opinion of the International Searching Authority, or the Declaration, PCT Rule 44.1, International Application No. PCT/US2009/060411, mailed Jan. 29, 2010, 15 pages.
Jin et al., "A 70-GHz Transformer-Peaking Broadband Amplifier in 0.13-um CMOS Technology," Microwave Symposium Digest, 2008 IEEE MTT-S International, Jun. 15, 2008, XP031343325, ISBN: 978-1-4244-1780-3, pp. 285-288.
Horn et al., "Integrated Transmission Line Transformer," Microwave Symposium Digest, 2004 IEEE MTT-S International, Jun. 6-11, 2004, XP010727263, ISBN: 978-0-7803-8331-9, pp. 201-204.
Kunasani et al., "Multilayer Aperture-Coupled Broadside Microstrip Lines," Microwave Symposium Digest 1995, IEEE MTT-S International, May 16, 1995, ISBN: 978-0-7803-2581-4, XP010612567, pp. 1367-1369.
El-Gharniti et al., "305 GHz SiGe UWB LNA Using On-Chip Transformer for Broadband Matching," Solid-State Circuits Conference, 2006, ESSCIRC 2006, Proceedings of the 32nd European, IEEE, XP0301046900, ISBN: 978-1-4244-0303-5, pp. 255-258, Sep. 1, 2006.
Bahl, I., "Broadband and Compact Impedance Transformers for Microwave Circuits," Microwave Magazine, vol. 7, Issue 4, Aug. 2006, pp. 56-62.

(Continued)

*Primary Examiner* — Khanh V Nguyen
(74) *Attorney, Agent, or Firm* — Baker Botts L.L.P.

(57) ABSTRACT

A power amplifier includes a transistor, a transmission line transformer, and a capacitor. The transistor is operable to receive a signal and to generate an amplified signal. The transistor has a source, a drain, and a gate. The gate has a first impedance and is operable to receive the signal to be amplified. The transmission line transformer has a first, second, third, and fourth port, the first port and the third port being coupled directly to the gate of the transistor, and the fourth port being coupled to a source device having a second impedance. The capacitor has a first end and a second end. The first end of the capacitor is coupled to the second port of the transmission line transformer and the second end is coupled to a ground.

20 Claims, 3 Drawing Sheets

OTHER PUBLICATIONS

Bahl, I., "208 GHz 8W Power Amplifier MMIC Developed Using MSAG MESFET Technology," Microwave and Wireless Components Letters, vol. 18, Issue 1, Jan. 2008, pp. 52-54.

Kian, Sen Ang et al., "Analysis and Design of Coupled Line Impedance Transformers," DSO National Laboratories, 20 Science Park Drive, Singapore, 118230, MTTS 2004 Digest, pp. 1951-1954, 2004.

* cited by examiner

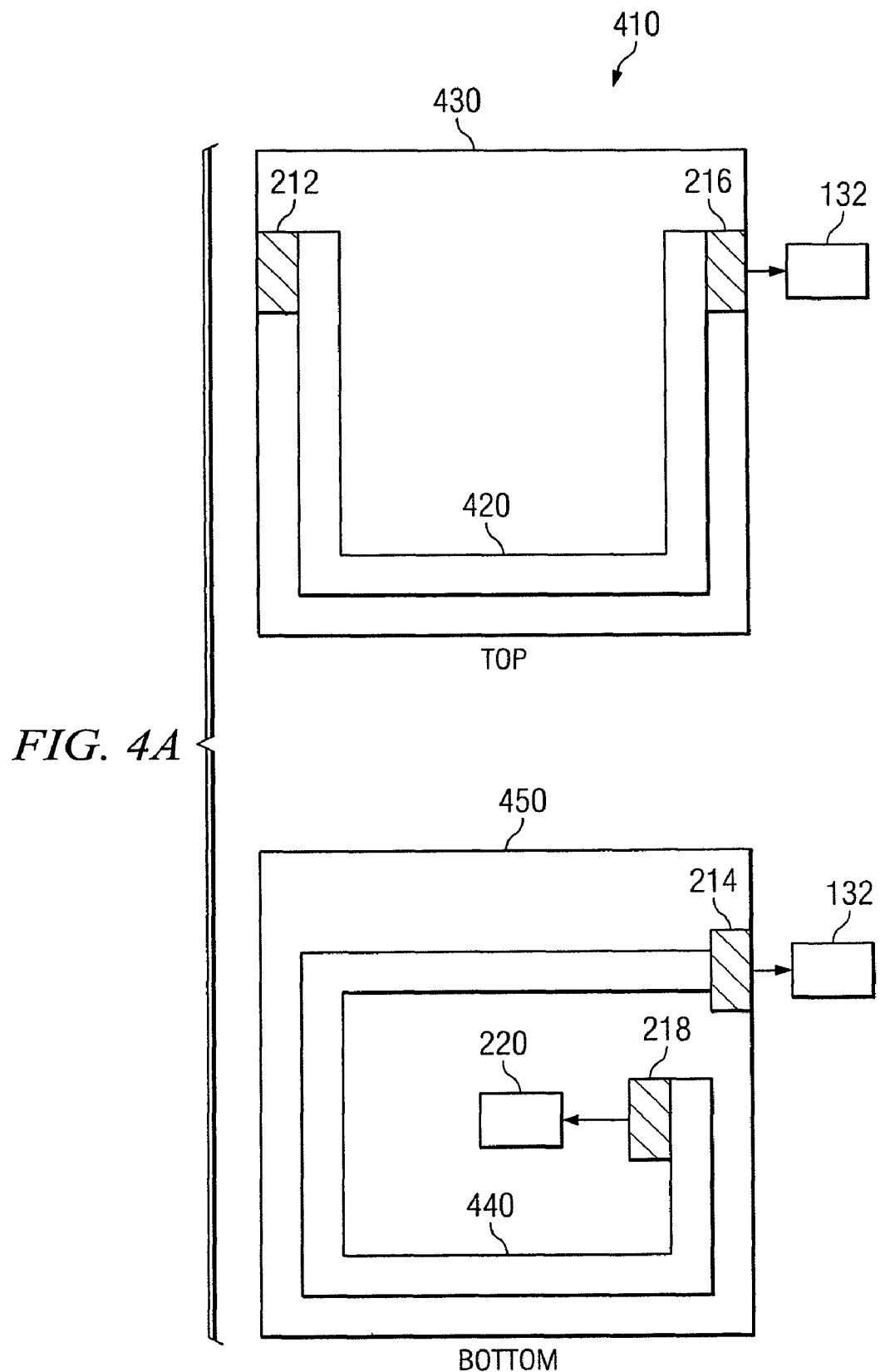

METHOD AND SYSTEM FOR AMPLIFYING A SIGNAL USING A TRANSFORMER MATCHED TRANSISTOR

RELATED APPLICATIONS

This application is a continuation of application Ser. No. 12/257,824 filed Oct. 24, 2008 entitled "Method and System for Amplifying a Signal Using a Transformer Matched Transistor," now U.S. Pat. No. 7,898,340.

TECHNICAL FIELD

This disclosure relates generally to the field of power amplifiers and more specifically to a method and system for amplifying a signal using a transformer matched transistor.

BACKGROUND

A typical power amplifier includes one or more transistor stages. Each transistor stage supplies excitation to an input signal from a signal source in order to amplify the input signal and provide the amplified signal to a next transistor stage or a receiver.

In order to efficiently transfer the input signal from the signal source to the output transistor stage of a power amplifier, the input impedance of the output transistor stage needs to closely match the impedance of the signal source. The input impedance to each transistor stage of a power amplifier, however, is typically very small and difficult to match.

SUMMARY OF THE DISCLOSURE

According to one embodiment of the present disclosure, a power amplifier includes a transistor, a transmission line transformer, and a capacitor. The transistor is operable to receive a signal and to generate an amplified signal. The transistor has a source, a drain, and a gate. The gate has a first impedance and is operable to receive the signal to be amplified. The transmission line transformer has a first, second, third, and fourth port, the first port being coupled to the gate of the transistor and the third port, and the fourth port being coupled to a source device having a second impedance. The transmission line transformer is operable to efficiently transport a signal from the source device to the transistor by matching the first impedance and second impedance. The capacitor has a first end and a second end. The first end of the capacitor is coupled to the second port of the transmission line transformer and the second end is coupled to a ground.

Certain embodiments of the disclosure may provide one or more technical advantages. A technical advantage of one embodiment may be that an input signal from a signal source may be more efficiently transferred to an output transistor of a power amplifier. The improved transfer of the input signal may improve the bandwidth and efficiency of the power amplifier. Other advantages may include requiring standard foundry processes to implement the transmission line transformer. This results in more economical circuits and a reduction in overall system costs. Additionally, the use of a capacitor connecting the transmission line transformer to ground allows a transistor gate DC bias to be supplied along with the input signal. The DC bias may allow more efficient transistor operation.

Certain embodiments of the disclosure may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present disclosure and its features and advantages, reference is now made to the following description, taken in conjunction with the accompanying drawings, in which:

FIGS. 4A and 4B illustrate a transmission line transformer in accordance with a particular embodiment of this disclosure.

DETAILED DESCRIPTION OF THE DRAWINGS

Embodiments of the present disclosure and its advantages are best understood by referring to FIGS. 1 through 4 of the drawings, like numerals being used for like and corresponding parts of the various drawings.

Figure 1:
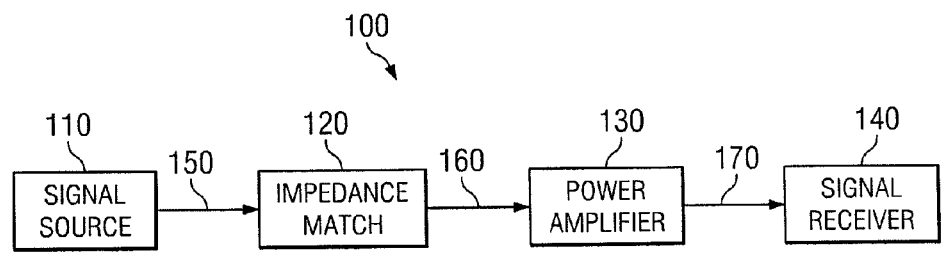
FIG. 1 is a circuit diagram of one embodiment of a power amplifier that may be used to amplify a signal.

FIG. 1 is a diagram of a power amplifier system 100 that may be used to amplify a signal. Power amplifier system 100 includes a signal source 110, an impedance match device 120, a power amplifier 130, and a signal receiver 140. Signal source 110 is coupled to impedance match device 120 and provides an input signal 150 to be amplified. Impedance match device 120 is coupled to and provides a matched signal 160 to power amplifier 130. Power amplifier 130 is coupled to and provides an amplified signal 170 to signal receiver 140.

In operation, signal source 110 provides input signal 150 to impedance match device 120. Signal source 110 may be any device that supplies a signal such as a signal generator, a cable, another power amplifier 130, and the like. In some embodiments, signal source 110 may also supply a DC bias to input signal 150 in order to control the operation of power amplifier 130. Input signal 150 may be any electrical signal including, but not limited to, signals utilized in radars, communication systems, electronic warfare systems, and the like, and may include a DC offset component. Impedance match device 120 receives input signal 150 and outputs matched signal 160. Matched signal 160 may be identical to input signal 150 except for any loss associated with the transfer of input signal 150 from signal source 110 through impedance match device 120. Power amplifier 130 receives matched signal 160, amplifies matched signal 160, and outputs amplified signal 170 to signal receiver 140.

Impedance match device 120 attempts to match the input impedance of power amplifier 130 as closely as possible to the impedance of signal source 110 in order to efficiently transfer input signal 150. For example, if signal source 110 is a typical transmission cable found in a communications system, it may have an impedance of approximately 50 ohms. Additionally, if power amplifier 130 is a typical last stage of a high-power amplifier, it may have an input impedance of approximately 1 ohm. Impedance match device 120 is then utilized to match the 50 ohm impedance of the cable to the 1 ohm input impedance of the high-power amplifier so that matched signal 160 is as identical to input signal 150 as possible.

Typical power amplifiers such as power amplifier system 100 employ a shunt capacitor immediately on the gate of an output transistor of the power amplifier in order to match the higher impedance of the signal source with the lower impedance of the power amplifier. While shunt capacitors in systems such as these are effective at matching the impedances, they typically cause the power amplifier to have a narrow bandwidth.

Figure 2:
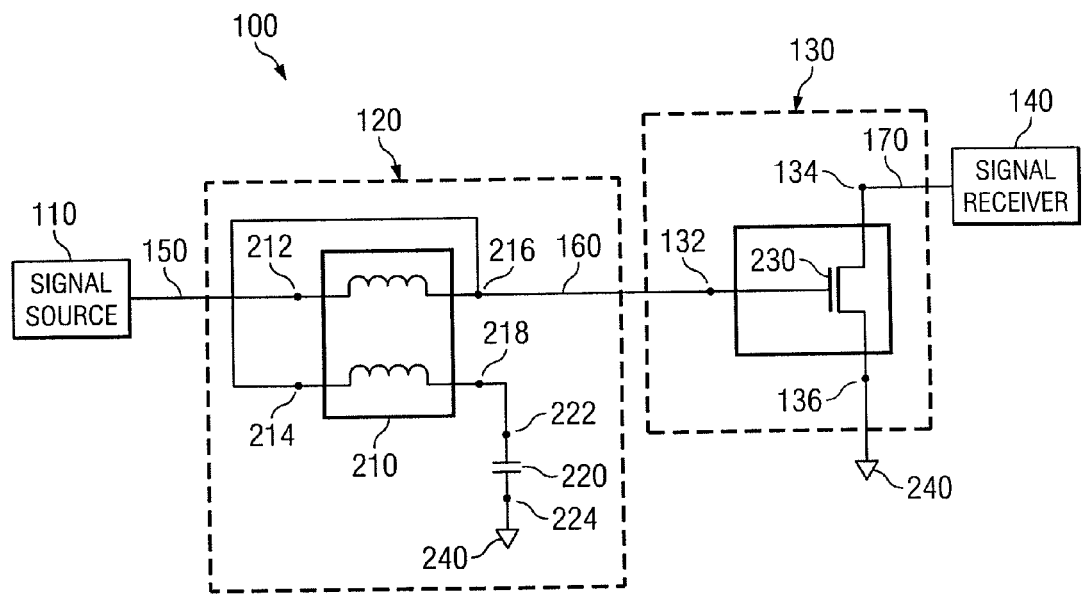
FIG. 2 is a circuit diagram of an example power amplifier of the embodiment of FIG. 1.
Figure 3:
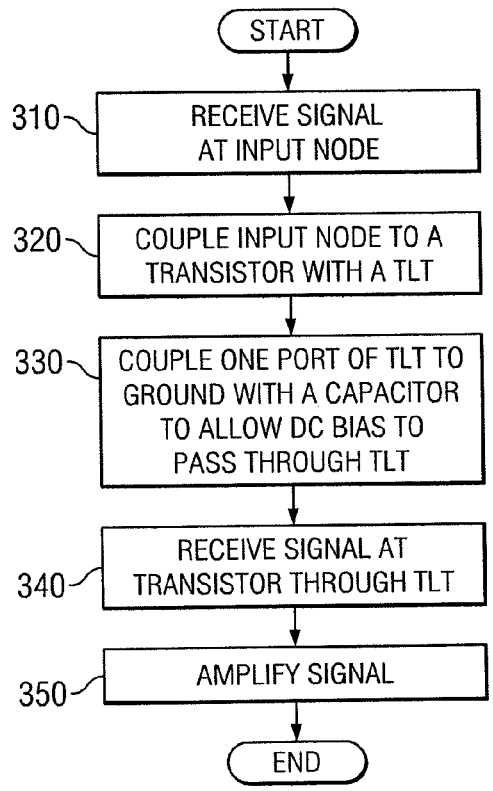
FIG. 3 is a flow chart illustrating a signal amplification method in accordance with a particular embodiment of this disclosure.

The teachings of the disclosure recognize that it would be desirable to be able to transform the lower impedance of a power amplifier input into a higher impedance while increasing the bandwidth of the power amplifier over systems utilizing typical shunt capacitors. FIGS. 2 and 3 below illustrate a system and method of addressing problems associated with typical shunt capacitors and power amplifiers.

FIG. 2 is a circuit diagram illustrating in more detail a portion of power amplifier system 100 according to the teachings of the disclosure. FIG. 2 includes coupled lines connected as a transmission line transformer 210, a capacitor 220, a transistor 230, and a ground 240.

Transmission line transformer 210 is well known in the art and includes a port 212, a port 214, a port 216, and a port 218. Capacitor 220 includes a first end 222 and a second end 224. Capacitor 220 may be any size of capacitor that is sufficient to provide a low RF impedance, and generally depends on the frequency of input signal 150. Transistor 230 may include a source 136, a drain 134, and a gate 132, and may be a field effect transistor. Transistor 230 may be, for example, an output transistor of an amplifier circuit. Port 212 is coupled to signal source 110. Port 216 is coupled to port 214, and is further coupled to gate 132 of power amplifier 130. Port 218 is coupled to first end 222 of capacitor 220, and second end 224 of capacitor 220 is coupled to ground 240. Drain 134 of transistor 230 is coupled to signal receiver 140, and source 136 of transistor 230 is coupled to ground 240.

In operation, transmission line transformer 210 may be utilized as impedance match device 120 as described above in reference to FIG. 1 in order to efficiently transmit input signal 150 from signal source 110 to gate 132 of transistor 230. Transmission line transformer 210 first receives input signal 150 via port 212 from signal source 110. Input signal 150 may be any electrical signal as described above and may include a DC offset component. Signal source 110 has an output impedance that may be approximately 50 ohms as described above. It should be noted, however, that signal source 110 may have any impedance and transmission line transformer 210 is not limited to receiving signals from a source having a 50 ohm impedance. Once transmission line transformer 210 receives input signal 150, transmission line transformer 210 transports input signal 150 and outputs matched signal 160 to gate 132 of transistor 230 via port 216. Transistor 230 then amplifies matched signal 160 and outputs amplified signal 170 to signal receiver 140 via drain 134.

Transistor 230 may have an input impedance of approximately 1 ohm at gate 132. Transmission line transformer 210, in combination with capacitor 220 as shown in FIG. 2, matches the input impedance of transistor 230 at gate 132 to the output impedance of signal source 110 at port 212. As a result, matched signal 160 arrives at gate 132 with minimal signal loss. In addition, the bandwidth of transistor 230 is increased over typical power amplifiers that utilize a shunt capacitor directly on gate 132 of transistor 230.

Most transistors in power amplifier applications do not operate well without a DC gate bias. Additionally, most transmission line transformers couple port 218 directly to ground and are therefore unable to pass a DC bias through to a coupled transistor. However, power amplifier system 100 overcomes these problems by coupling capacitor 220 to port 218 of transmission line transformer 210. As a result, a DC gate bias may be passed through transmission line transformer 210 via input signal 150 and be applied to gate 132 of transistor 230. This may allow for more efficient operation of transistor 230.

In some embodiments, source device 110 may be another transmission line transformer 210. In these embodiments, back-to-back transmission line transformers 210 are utilized to achieve a desired bandwidth not available by utilizing a single transmission line transformer 210.

FIG. 3 illustrates an example signal amplification method 300 that may be utilized to efficiently and effectively amplify a signal according teachings of the disclosure. Signal amplification method 300 begins in step 310 where an input signal to be amplified is received at an input node from a signal source. The input signal may be, for example, input signal 150 as described above. In step 320, the input node is coupled to a transistor with a transmission line transformer ("TLT"). The transistor may be transistor 230 as described above, and the TLT may be transmission line transformer 210 as described above. The TLT is coupled directly to the gate of the transistor and is utilized to match the impedance the gate of the transistor with the signal source.

In step 330, one port of the TLT is coupled to a ground via a capacitor. The capacitor maintains the electrical connection of the TLT while isolating the gate DC bias from ground and delivering a DC bias through the TLT to the transistor. In step 340, the input signal is received at the gate of the transistor via the TLT. Finally, the input signal is amplified by the transistor in step 350.

Figure 4B:
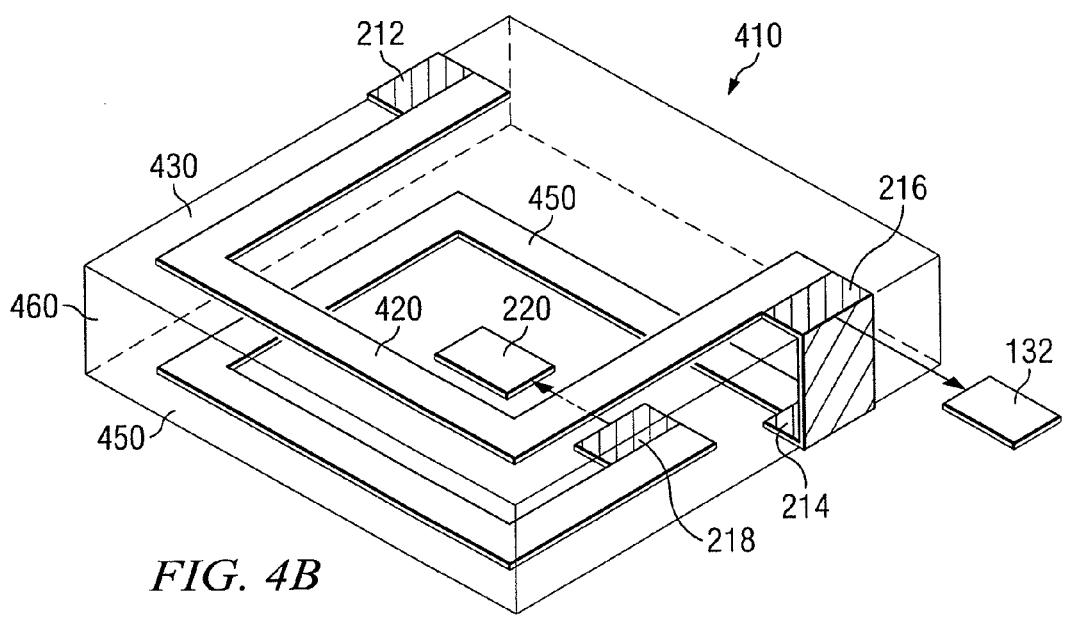

FIGS. 4A and 4B illustrate an example transmission line transformer 410 that may be implemented as transmission line transformer 210 above. In some embodiments, transmission line transformer 410 is implemented in a microwave monolithic integrated circuit ("MMIC") amplifier to match the impedance of an output transistor. Unlike typical MMIC transmission line transformers which are formed by utilizing expensive additional dielectric layers, however, transmission line transformer 410 is formed using standard foundry processes. As a result, transmission line transformer 410 is more economical.

Transmission line transformer 410 includes a top line 420 formed on a top circuit board layer 430, a bottom line 440 formed on a bottom circuit board layer 450, and a dielectric 460 that is between top layer 430 and bottom layer 450. Together, top line 420, bottom line 440, and dielectric 460 form a broadside microstrip coupler and are created using standard capacitor elements. Top line 420 is coupled to port 212 on one end and port 216 on the other end as shown in FIG. 4. Likewise, bottom line 440 is coupled to port 214 on one end and port 218 on the other end as shown in FIG. 4. Port 216 is coupled to port 214 and gate 132 of transistor 230, and port 218 is coupled to capacitor 220.

In operation, an input signal such as input signal 150 above arrives at port 212 from signal source 110. Once transmission line transformer 410 receives input signal 150, transmission line transformer 410 transports input signal 150 via top line 420 and bottom line 440 to port 216. Transistor 230 then amplifies matched signal 160 and outputs amplified signal 170 to signal receiver 140 via source 134.

Although the embodiments in the disclosure have been described in detail, numerous changes, substitutions, variations, alterations, and modifications may be ascertained by those skilled in the art. For example, FIGS. 4A and 4B depict top line 420 on top circuit board layer 430 and bottom line 440 on bottom circuit board layer 450. Other embodiments, however, may implement top line 420 on bottom circuit board layer 450 and bottom line 440 on top circuit board layer 430. Additionally or alternatively, other embodiments may utilize a bipolar junction transistor having a base, a collector, and an emitter rather than transistor 130 having gate 132, drain 134, and source 136. It is intended that the present disclosure encompass all such changes, substitutions, variations, alterations and modifications as falling within the spirit and scope of the appended claims.

What is claimed is:

1. A circuit for amplifying a signal, comprising:
   a transistor operable to receive a signal to be amplified and to generate an amplified signal, the transistor having a source, a drain, and a gate, the gate having a first impedance and operable to receive the signal to be amplified;
   a transmission line transformer having a first, second, third, and fourth port, the first port and the third port coupled directly to the gate of the transistor, and the fourth port coupled to a source device having a second impedance, the transmission line transformer operable to efficiently transport a signal from the source device to the gate of the transistor by matching the first impedance and the second impedance; and
   a capacitor having a first end and a second end, the first end coupled to the second port of the transmission line transformer and the second end coupled to a ground.

2. The circuit of claim 1, wherein the transmission line transformer comprises a broadside microstrip coupler.

3. The circuit of claim 2, wherein the broadside microstrip coupler comprises capacitor elements, the capacitor elements further comprising a top line and a bottom line, the top line residing on a top circuit board layer and the bottom line residing on a bottom circuit board layer, the top circuit board layer being separated from the bottom circuit board layer by a dielectric.

4. The circuit of claim 1, wherein the source device comprises a second transmission line transformer.

5. The circuit of claim 1, wherein the transistor, the transmission line transformer, and the capacitor comprise devices in a microwave monolithic integrated circuit.

6. The circuit of claim 1, wherein the signal comprises an electrical signal having a DC bias and the transmission line transformer operable to pass the DC bias from the source device to the gate of the transistor.

7. A method for coupling a signal to a power amplifier comprising:
   receiving a signal to be amplified from an output node of a source device;
   impedance matching the output node of the source device to an input gate of a transistor by a transmission line transformer, the transmission line transformer having a first port, a second port, a third port, and a fourth port, the first port and the third port coupled directly to the input gate of the transistor, the fourth port coupled to the output node of the source device, and the second port coupled to a ground through a capacitor; and
   transmitting the signal from the output node of the source device to the input gate of a transistor with the transmission line transformer.

8. The method of claim 7 further comprising:
   receiving the signal at the gate of the transistor;
   amplifying the signal with the transistor to create an amplified signal;
   transmitting the amplified signal to a receiver.

9. The method of claim 7, wherein the transmission line transformer comprises a broadside microstrip coupler.

10. The method of claim 9, wherein the broadside microstrip coupler comprises capacitor elements, the capacitor elements further comprising a top line and a bottom line, the top line residing on a top circuit board layer and the bottom line residing on a bottom circuit board layer, the top circuit board layer being separated from the bottom circuit board layer by a dielectric.

11. The method of claim 7, wherein the source device comprises a second transmission line transformer.

12. The method of claim 7, wherein the transistor, and the transmission line transformer comprise devices in a microwave monolithic integrated circuit.

13. The method of claim 8, wherein the receiver comprises a second transistor.

14. The method of claim 7 further comprising transmitting a DC bias from the output node of the source device to the input gate of a transistor with the transmission line transformer.

15. A microwave monolithic integrated circuit comprising:
   a transistor having a gate operable to receive a signal to be amplified, the gate having a first impedance;
   a transmission line transformer having a first, second, third, and fourth port, the first port and the third port coupled directly to the gate of the transistor, and the fourth port coupled to a source device having a second impedance; and
   a capacitor having a first end and a second end, the first end coupled to the second port of the transmission line transformer and the second end coupled to a ground;
   wherein the transmission line transformer comprises a broadside microstrip coupler.

16. The microwave monolithic integrated circuit of claim 15, wherein the source device comprises a second transmission line transformer.

17. The microwave monolithic integrated circuit of claim 15, wherein the broadside microstrip coupler comprises capacitor elements, the capacitor elements further comprising a top line and a bottom line, the top line residing on a top circuit board layer and the bottom line residing on a bottom circuit board layer, the top circuit board layer being separated from the bottom circuit board layer by a dielectric.

18. The microwave monolithic integrated circuit of claim 15, wherein the transistor is an output transistor of an amplifier.

19. The microwave monolithic integrated circuit of claim 15, wherein the transmission line transformer is operable to match the first impedance and the second impedance.

20. The microwave monolithic integrated circuit of claim 15, wherein the signal to be amplified comprises an electrical signal having a DC bias and the transmission line transformer operable to pass the DC bias from the source device to the gate of the transistor.

* * * * *